United States Patent
Akselband

(10) Patent No.: US 6,665,184 B2
(45) Date of Patent: Dec. 16, 2003

(54) TAPERED COLD PLATE

(75) Inventor: Boris Akselband, Brighton, MA (US)

(73) Assignee: Lytron, Inc., Woburn, MA (US)

(*) Notice: Subject to any disclaimer, the term of this patent is extended or adjusted under 35 U.S.C. 154(b) by 0 days.

(21) Appl. No.: 10/195,238

(22) Filed: Jul. 15, 2002

(65) Prior Publication Data

US 2003/0015314 A1 Jan. 23, 2003

Related U.S. Application Data

(60) Provisional application No. 60/305,480, filed on Jul. 13, 2001.

(51) Int. Cl.[7] ................................................ H05K 2/20
(52) U.S. Cl. ..................... 361/699; 361/698; 361/711; 361/721; 165/80.4; 165/104.33; 174/15.1
(58) Field of Search .................. 361/689–690, 361/698–700, 702, 703, 707, 711, 716, 720, 721, 727; 174/15.1, 15.2, 16.1, 16.3, 252; 165/80.3, 80.4, 104.33; 211/41.17

(56) References Cited

U.S. PATENT DOCUMENTS

| | | | |
|---|---|---|---|
| 4,155,402 A | 5/1979 | Just | 165/46 |
| 4,226,281 A | 10/1980 | Chu | 165/80 A |
| 4,298,903 A | 11/1981 | Ellis | 361/386 |
| 4,298,904 A | 11/1981 | Koenig | 361/386 |
| 4,298,905 A | 11/1981 | Bosler et al. | 361/386 |
| 4,685,211 A | 8/1987 | Hagihara et al. | 29/832 |
| 4,693,303 A | 9/1987 | Okada | 165/80.4 |
| 4,958,257 A | 9/1990 | Wenke | 361/385 |
| 5,050,037 A | 9/1991 | Yamamoto et al. | 361/385 |
| 5,057,968 A | * 10/1991 | Morrison | 361/700 |
| 5,071,013 A | 12/1991 | Peterson | 211/41 |
| 5,228,517 A | 7/1993 | Brownell | 166/369 |
| 5,262,587 A | 11/1993 | Moser | 174/15.1 |
| 5,309,319 A | 5/1994 | Messina | 361/699 |
| 5,343,361 A | 8/1994 | Rudy, Jr. et al. | 361/710 |
| 5,394,299 A | 2/1995 | Chu et al. | 361/705 |
| 5,537,291 A | 7/1996 | Onodera et al. | 361/699 |
| 5,812,373 A | 9/1998 | Hwang | 361/704 |
| 5,812,374 A | * 9/1998 | Shuff | 361/704 |
| 5,826,643 A | 10/1998 | Galyon et al. | 165/80.4 |
| 5,920,457 A | 7/1999 | Lamb et al. | 361/699 |
| 5,986,887 A | 11/1999 | Smith et al. | 361/704 |
| 6,065,208 A | 5/2000 | Lamb et al. | 29/890.03 |
| 6,084,771 A | * 7/2000 | Ranchy et al. | 361/699 |
| 6,173,759 B1 | 1/2001 | Galyon et al. | 165/80.4 |
| 6,313,995 B1 | * 11/2001 | Koide et al. | 361/705 |
| 6,411,512 B1 | * 6/2002 | Mankaruse et al. | 361/700 |
| 6,466,441 B1 | * 10/2002 | Suzuki | 361/695 |

FOREIGN PATENT DOCUMENTS

| | | | | |
|---|---|---|---|---|
| JP | 02297999 A | * | 12/1990 | H05K/7/20 |
| JP | 04329697 A | * | 11/1992 | H05K/7/20 |

* cited by examiner

*Primary Examiner*—Boris Chervinsky
(74) *Attorney, Agent, or Firm*—Weingarten, Schurgin, Gagnebin & Lebovici LLP

(57) ABSTRACT

Cold plates, permanently plumbed into card cage, cool circuit boards that are equipped with personality plates to improve thermal transfer. The personality plates have a contoured surface that is the complement of the circuit board's landscape. The personality plate made of heat transmissive material therefore contacts each heat generating component, regardless of its height. The opposite surface of the personality plate is flat, and, when installed with the circuit board in the card cage, lies parallel to the surfaces of the cold plate. A card ejector applies force on the entire board bringing the flat surfaces into intimate contact for excellent heat transfer. The assembly of circuit board and personality plates is augmented by interposing thermal interface material at each contact surface and fastening this assembly into a unit.

18 Claims, 7 Drawing Sheets

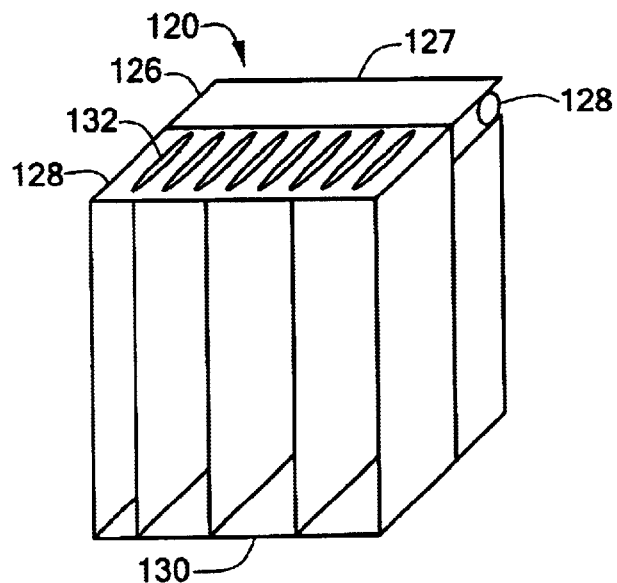
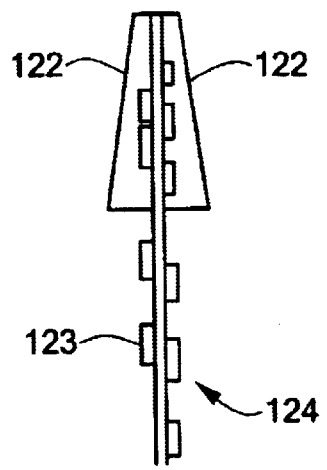
*FIG. 6A*   *FIG. 6B*
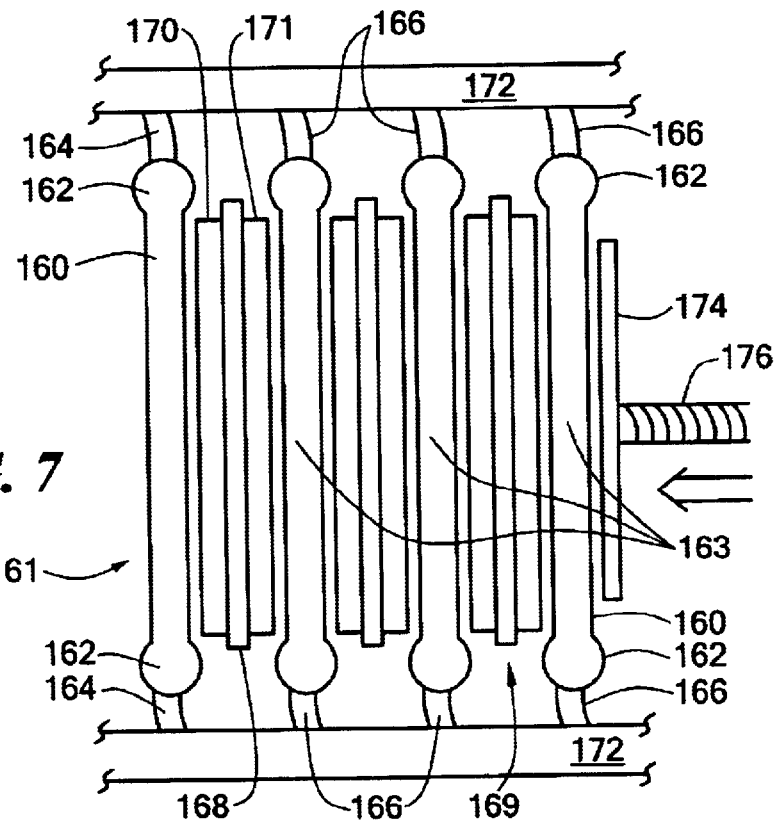
*FIG. 7*

TAPERED COLD PLATE

CROSS REFERENCE TO RELATED APPLICATIONS

This application claims priority under 35 U.S.C. §119(e) to provisional patent application serial No. 60/305,480 filed Jul. 13, 2001, the disclosure of which is hereby incorporated by reference.

STATEMENT REGARDING FEDERALLY SPONSORED RESEARCH OR DEVELOPMENT

N/A

BACKGROUND OF THE INVENTION

The present invention relates generally to cooling of circuit boards and, more specifically, to an apparatus and methods used for liquid-cooling circuit boards.

Electronic components mounted on circuit boards generate heat that must be dissipated to assure proper functioning of the components. Air is typically used to cool the circuit board when the total power dissipated is low or when the power density is low. The use of fans, ducting and/or heatsinks to improve air cooling is well understood and widely used in industry.

Air provides insufficient cooling when the total power used is high and in high density power applications because of air's relatively low thermal capacity. In high power applications, liquid can be used to provide significantly improved cooling, but at an added complexity level, since provision must be made to contain the liquid so it does not contact the components directly.

A way to contain cooling liquid is to use a liquid-cooled cold plate. A liquid-cooled cold plate is typically made of copper, aluminum or their alloys, although other materials can be used. It has channels within it that distribute the cooling liquid and has inlets and outlets that enable the liquid to enter and exit the cold plate. The cold plate is then mated to the electronic circuit board that requires cooling. Electrical components on the circuit board that touch the cold plate are cooled. They become cool because of their close proximity to the cold plate that transfers the heat to the cooling liquid, but at no time do they actually touch the cooling liquid directly.

The fact that cold plates are co-mounted with the circuit boards implies that these cold plates must be removable when the circuit board is removed. Removing the cold plate implies severing the liquid cooling connections. When leaks occur in cold plates, they do not occur within the cold plate but rather occur where the plumbing connections are made to the plate. The plumbing connection is especially challenging when there is a need for the connection to be temporary.

While liquids cool much more effectively than air, systems using cooling liquids are subject to leaking. If a liquid leak occurs in the proximity of an electronic circuit board, it can create a serious problem. This problem can be mitigated by choice of liquid. Water has an excellent heat transfer function, but a water leak can short out electrical components and cause permanent damage. High dielectric fluids, such as fluorocarbons, have been used in liquid cooling to limit the damage caused by a leak. The disadvantages to this approach are that fluorocarbons have a less advantageous heat transfer function than water and fluorocarbons are expensive. In addition, fluorocarbons easily leak through conventional pump seals increasing the number of leaks. In addition, fluorocarbons can still cause damage to electronic systems.

There is a wide variety of cold plate technologies currently in use. Lower performance cold plates commonly use internal metal tubes to distribute the liquid. Higher performance cold plates commonly use vacuum brazed construction. Vacuum brazing allows the use of high performance fins placed within the liquid channel at locations where better heat transfer is required with the cold plate surface.

A further difficulty with cold plate cooling is that the components on a circuit board are seldom at the same height. If the cold plate is substantially planar, only the tallest components will touch the cold plate and be cooled. For small variations in height (~0.01"), compliant thermal interface material can be applied to lower components allowing the components to touch the cold plate through the interface. However, when the variations are larger, the compliant thermal interface material is not sufficient to bridge the gap.

A cold plate having a "personality profile" impressed on its side to mate with the component board is one solution to the larger gap issue. This personality profiled cold plate is thicker in places where short components are on the circuit board and is thinner where the taller components are located. Such personalized cold plates must be custom made and can only be used with one type of board. They are difficult to manufacture because the internal liquid path must be adapted to the personality contours of the cold plate. Typically these plates must be inserted and extracted with the circuit board, requiring the use of temporary connections to the cooling liquid source.

BRIEF SUMMARY OF THE INVENTION

A populated printed circuit board cooling system comprises a cold plate and a set of personality plates that assure good contact between the printed circuit board and the cold plate. The cold plate is formed of a heat transmissive material that has internal liquid circulating paths. The cold plate must have an inlet and an outlet port for the circulating liquids. These ports are incorporated in at least one header portion of the cold plate for permanent connection to a liquid circulating source and return. If only one header is used, it is formed as a split header separating the supply and return. The ports may also be split between two headers. The cold plate has a header portion and a flat portion having two flat planar surfaces. The flat planar surfaces may be the opposite sides of a rectangular block or may be joined to form a wedge. The header portion is connected to the top and/or bottom of the flat portion. The remaining sides are sealed to provide a closed environment for the circulating liquid. Each personality plate is formed of a heat transmissive material and has a flat side and a contoured side. The contoured side conforms to the contour of one side of the populated printed circuit board. When the flat surfaces of the cold plate and a personality plate are butted against each other and the side of the printed circuit board is cradled in the contoured side of its personality plate, heat is transferred from components on the printed circuit board through the personality plate to the cold plate to be removed by a circulating liquid.

The heat transmissive materials available include copper, aluminum and their alloys. One or two headers can be used, and each header can have baffles and gates to direct the liquid in a particular circuit through the cold plate. Thermal interface material may be used within the system wherever heat transference is desired. The thermal interface material improves the thermal contact between the heat sources and the cooling mechanisms.

An apparatus for cooling the components on printed circuit boards is made up of a card cage incorporating cold plates and circuit board assemblies that adapt the printed circuit boards to the cold plates and card cage. The plurality of cold plates are each connected to a mechanism that is circulating cooling liquid through a plurality of headers mounted to the top and/or bottom of the cold plates. Each cold plate is formed as a wedge shape with the flat sides oriented towards the sides of the card cage, a narrow end oriented toward the front of the card cage and a wider end oriented toward the rear of the card cage. The cold plates are made of a heat transmissive material.

Each circuit board assembly is custom formed based on its printed circuit board. A pair of personality plates are tailored each to a respective side of the printed circuit board. One side of each personality plate is flat; the other is contoured. The first plate contoured surface is complementary to the contours of a first side of its printed circuit board and the second plate contoured surface is complementary to the contours of the second side of its printed circuit board. The personality plate flat surfaces are angled such that each completed circuit board assembly with personality plates is wedge shaped with a wedge angle complementary to the cold plates' angle. A fastening mechanism holds the personality plates and printed circuit board tightly pressed together forming the circuit board assembly. The circuit board assemblies are mounted in the card cage with the narrow end facing the rear of the card cage, so that the flat surfaces of the personality plates and their matching cold plate are parallel when installed. Interface material may cover the plate flat surfaces to improve thermal transfer. A plurality of clamping mechanisms, each structured to fully seat a circuit board assembly between a pair of cold plates, press the flat surfaces of the cold plates and the personality plates together forming a thermally conductive path from the components, through the personality plates to the cold plates.

A method of cooling populated printed circuit boards comprises fabricating a card cage incorporating wedge-shaped cold plates that are connected, permanently or otherwise, to a liquid circulating mechanism. The cold plates are arranged to allow board mounting between the cold plates. Printed circuit board assemblies are formed by sandwiching each populated printed circuit board between personality plates. One side of each personality plate conforms to the contours of one side of a particular populated printed circuit board and the other side has a flat surface. The personality plates are made of a heat transmissive material. When the printed circuit board assemblies are inserted into the card cage with the flat sides of the personality plates parallel to the flat sides of the cold plates heat transfer is enabled. By applying force to press the printed circuit board assemblies and cold plates together, the heat transfer is improved and circulating liquid removes the heat from the cold plates. Other aspects, features, and advantages of the present invention are disclosed in the detailed description that follows.

BRIEF DESCRIPTION OF THE SEVERAL VIEWS OF THE DRAWING

The invention will be understood from the following detailed description in conjunction with the drawings, of which:

FIG. 6A is a perspective drawing of a card cage using both liquid cooling and air cooling according to the invention;

FIG. 6B is a top view of a circuit board assembly for used in the card cage of FIG. 6A; and FIG. 7 is a side view of an embodiment of and assembly to provide contact between cold plates and circuit board assemblies according to the invention.

DETAILED DESCRIPTION OF THE INVENTION

Figure 1:
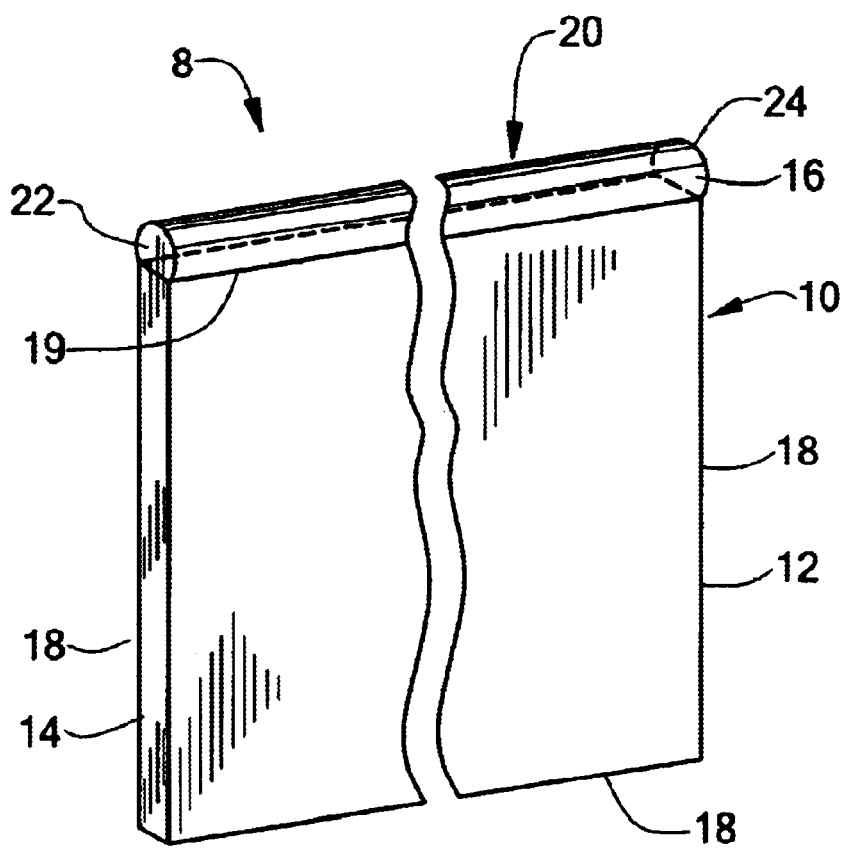
FIG. 1 is a perspective drawing of an embodiment of a cold plate according to the invention.

An embodiment of a cold plate according to the invention is shown in FIG. 1. The cold-plate 8 is a heat-transmissive structure, cooled by a circulating liquid, adapted to be placed near a heat source to cool the heat source. The heat-transmissive material may be copper, aluminum, and alloys based on copper or aluminum. The cold plate 8 is composed of at least two main parts, the flat portion 10 and the header portion 20. The flat portion is commonly wedge shaped as shown in FIG. 1, but can also be box shaped. Flat side 12 of the flat portion 10 is most usefully rectangular shaped, although other outlines can be accommodated. Wedge shaped flat portion 10 has two plate-like flat sides that are joined at the edges 18 to form a wedge where front face 14 is narrower than rear face 16.

FIG. 1 illustrates a single header 20 permanently attached to the top 19 of the flat portion 10 typically by a brazing, welding, soldering or similar process. The single header 20 is split to perform a dual function, bringing cooling liquid to the interior of the flat portion 10 and removing heated cooling liquid from the flat portion 10. Internal to the header 20 are channels and baffles that direct the liquid in a circuit from the source, past expected hot spots of the flat portion 10, and back to a return. In FIG. 1, the front end 22 of header 20 is closed off and the rear end 24 is available to connect to a liquid circulating system (not shown). The single split header 20 can be connected to either the top or bottom of the flat portion 10. The bottom of the flat portion is sealed when one header 20 is used at the top. While the cold plate of FIG. 1 is shown with one header 20, other embodiments with a top header and a bottom header bracketing the flat portion 10 allow for alternate circulation patterns. When two headers are used at the top and bottom, they may each be split headers, allowing a complex circulation pattern, or one may be dedicated to the source connection and the other dedicated to the return connection.

An item to be cooled could be placed on the flat portion 10 of cold plate 8. If the item to be cooled is not flat enough to allow good heat transfer, a heat transmissive interface material may be interposed between the item and the flat portion 10. The industry makes interface material that exhibits varying thermal transmissivity characteristics combined with other characteristics such as compressibility and electrical insulation. A designer charged with cooling the item specifies the characteristics of the interface material to be used. It is preferable to provide compression to assure a good contact between the item to be cooled and the cold plate. Such compression can be provided by weight or pressure on the item and interface material pressing the to the cold plate.

An adaptive personality plate for the item could be made to improve the interface between the cold plate and the item. The adaptive personality plate conforms to the item shape on one side and presents a flat surface on the other. Such an adaptive personality plate may be made of aluminum, copper, alloys of copper or aluminum, metal filled composite or other moldable material with high thermal transmissivity. Interface material may be interposed between the item and the personality plate and/or between the flat surface of the personality plate and the flat portion 10. The personality plate may in addition be fastened to the item providing compression to assure a good thermal contact.

When numbers of circuit boards are to be cooled by cold plates, card cages are typically designed to hold the boards and the cold plates in close contact. The design of an appropriate card cage requires consideration of such factors as height of components to be used on the circuit boards, spacing between the cold plates, amount of heat to be rejected, location of hot spots on the circuit boards and cost.

Figure 2:
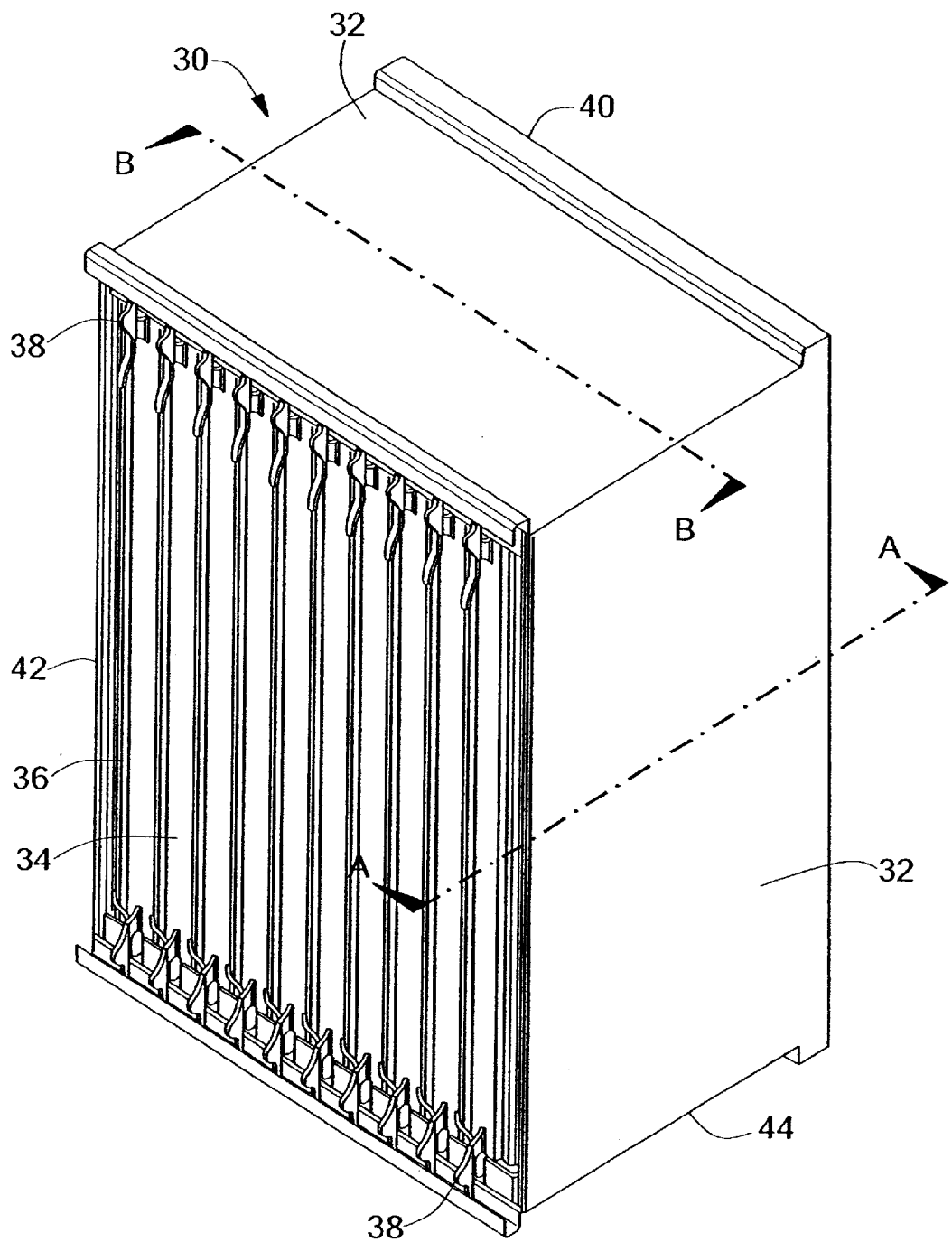
FIG. 2 is a perspective drawing of a card cage adapted for the invention.

An embodiment of a card cage designed to use cold plates to cool particular circuit boards fitted with personality plates is shown in FIG. 2. In FIG. 2, a card cage 30 is shown having an approximately solid top 30, bottom 44 and sides 32. Circuit board assemblies 36 are inserted in the front 42 and electrical connections are made through the back 40 or front 42 as appropriate. Cold plates 34 and their connections to a liquid cooling system (not shown) are built into the card cage 30. The liquid-cooled cold plate 34 can be permanently installed in the card cage 30 allowing permanent plumbing connections. The permanent plumbing connections reduce the risk of leaks allowing the use of water as the cooling medium, greatly improving the thermal performance and providing a much lower system cost than when using fluorocarbons. The cold plates 34 are arranged so that they are interleaved with the circuit board assemblies 36.

Figure 3C:
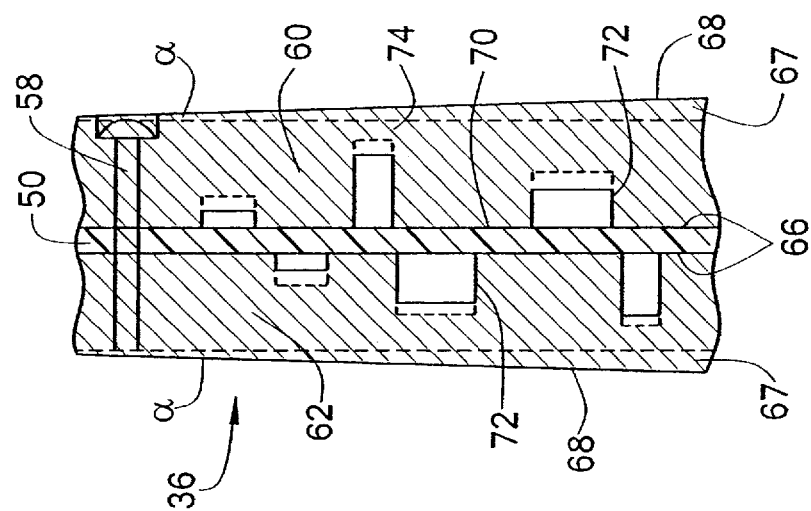
FIGS. 3A, 3B, and 3C are a side view of a portion of a circuit board assembly according to the invention.
Figure 3B:
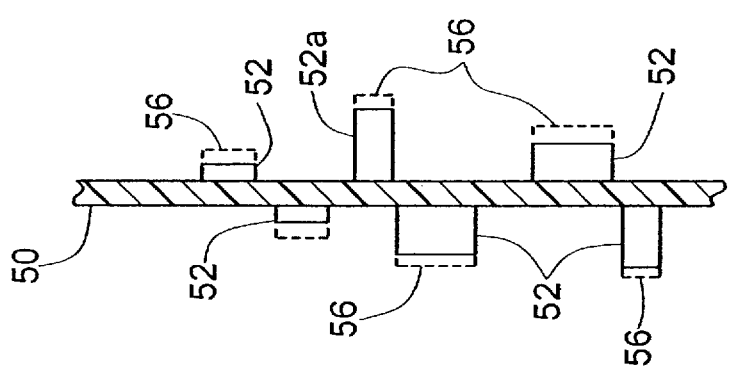
Figure 3A:
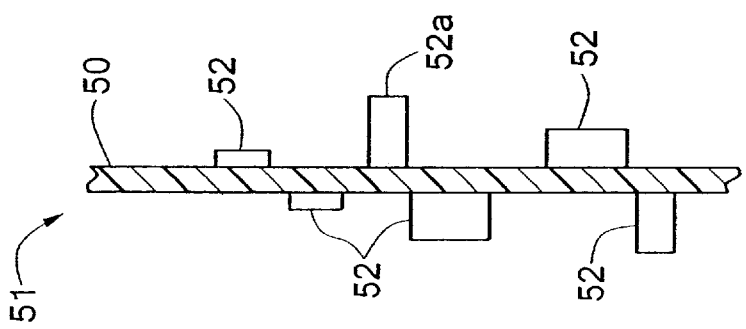

FIGS. 3A–3C illustrate the make-up of the circuit board assemblies 36. FIG. 3A shows a side view of the circuit board 51 comprising the board 50 with components 52 mounted on it. The components 52 mounted on this circuit board are of various heights but none is higher than component 52a. The majority of the heat being generated by the circuit board is generated by the components. In FIG. 3B, interface material 56 has been placed on the tops of all heat generating components 52. The interface material 56 will assure good thermal contact between the board 50, components 52 and an adjacent structure. Other implementations may use a thin interface material that covers the entire board including the components, but contact between the board itself and the interface material is usually not required.

In FIG. 3C, a completed circuit board assembly 36 is shown. Adaptive personality plates 60, 62 have been fit to the opposite sides of the circuit board. Each adaptive personality plate 60, 62 is made of a thermally transmissive material and has a contoured side 66 and a flat side 68. The heat sources 52 contact the contoured side 66 and the flat side 68 is on the outside of the circuit board assembly 36. The adaptive personality plates 60, 62 have an approximate tapered wedge shape at an angle a to dotted line parallel to the board 50. The contoured surface 66 has a nominal surface 70 parallel to the plane of the board 50. Sunk into the nominal surface 70 are cavities 72 that correspond to the components 52, each cavity being sized for its component's shape and height. A minimum thickness 74 of personality plate is maintained, even over the tallest component 52a to assure adequate structural integrity and thermal transmissivity.

Figure 3D:
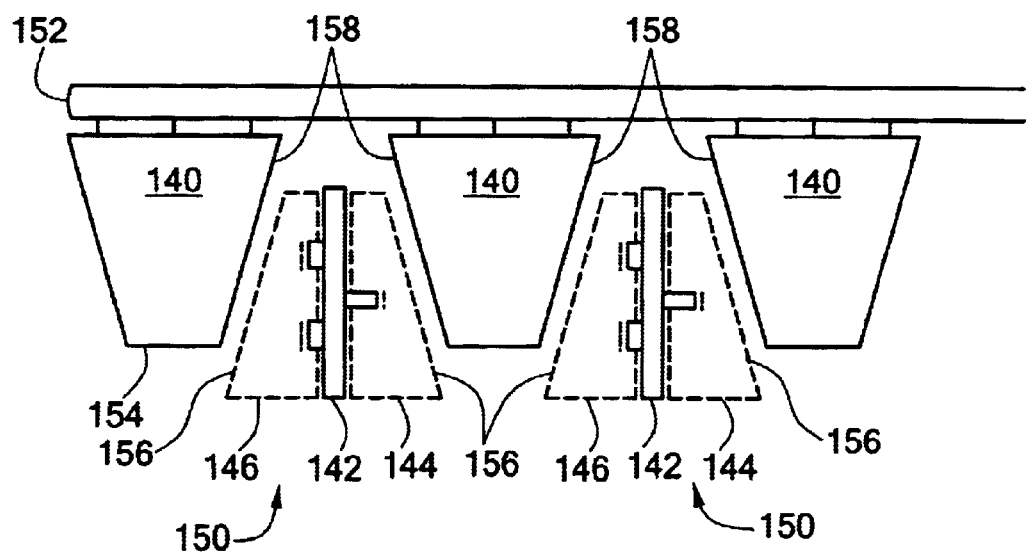
FIGS. 3D and 3E are a top view of circuit board assemblies and cold plates intermixed according to the invention.
Figure 3E:
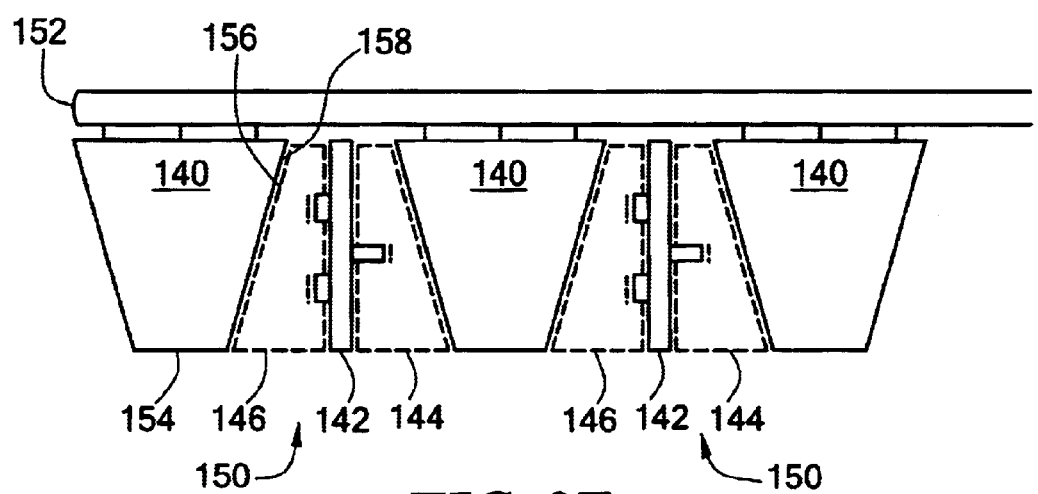

A fastening device 58, such as a recessed screw or bolt, holds the circuit board assembly 36 together. A layer of interface material (not shown) may be attached to the flat surfaces 68 of the circuit board assembly 36 before it is inserted in the card cage 30. FIGS. 3D and 3E are a top view of interleaved cold plates 140 and extremely tapered circuit board assemblies 150 to illustrate the operation of the tapered shapes in assembling the system. The actual taper is usually very slight 3–5°, but has been exaggerated in the figures. The cold plates 140 are plumbed to the cooling liquid source 152 and fixed in position with the narrow edge 154 facing the front of the card cage. Circuit board assemblies 150 are composed of a circuit board 142 and a set of personality plates 144, 146 clamped together with thermal interface material placed as needed. In FIG. 3D, the circuit board assemblies 150 are partially placed in the card cage. The flat sides 158 of the cold plates and the flat sides 156 of the personality plates 144, 146 are parallel and spaced apart allowing insertion of the circuit board assembly 150. In FIG. 3E, the circuit board assemblies 150 are seated in position. The respective flat sides 158, 156 are parallel and butted against each other forming a good thermal transmission path.

Figure 4A:
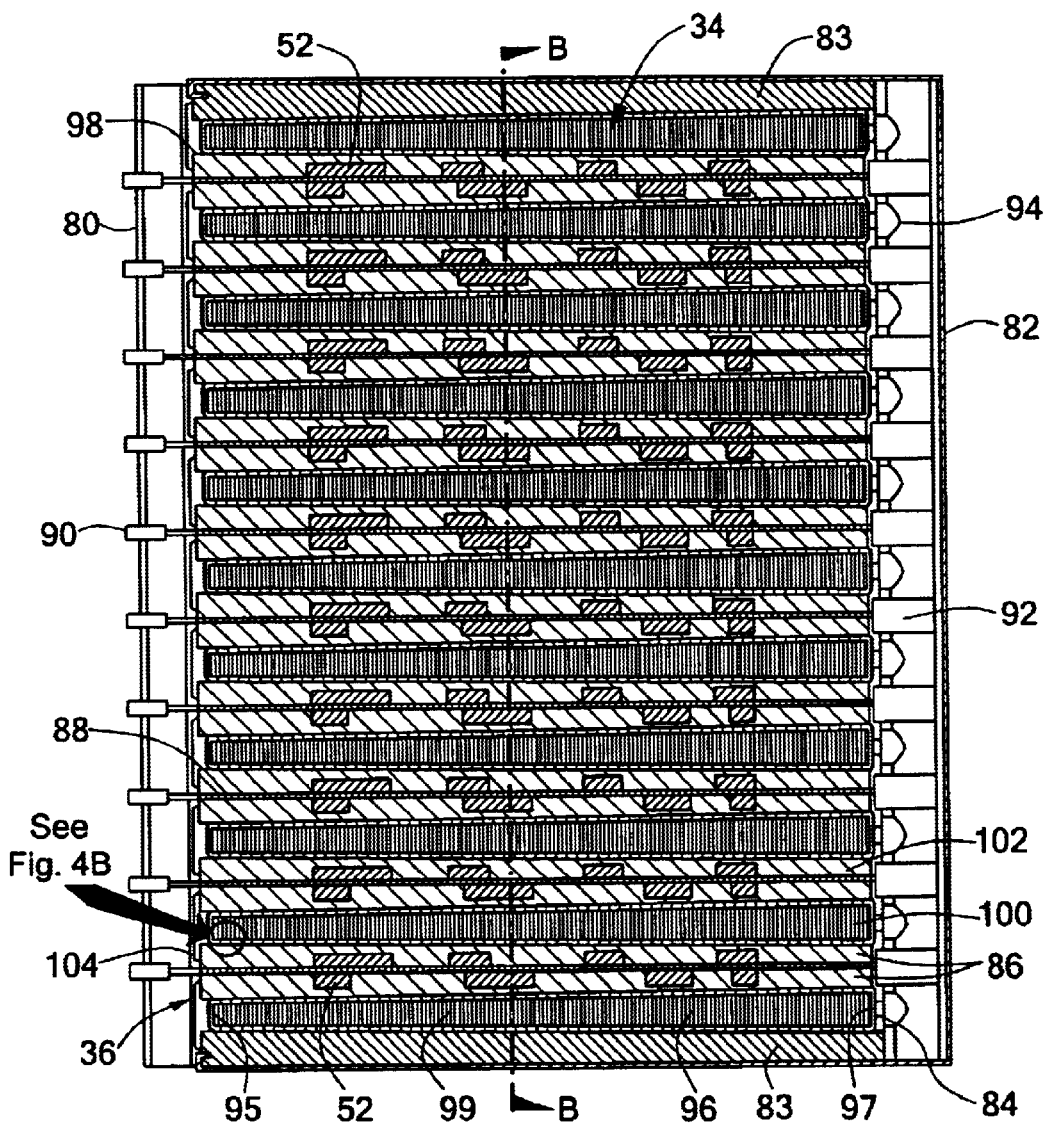
FIG. 4A is a section view of the card cage of FIG. 2.

FIG. 4A shows a view along section A—A of card cage 30. In this view, the front 80 of the card cage 36 is at the left and the back 82 of the card cage 30 is at the right. Sides 83 of the card cage 30 are to the top and bottom respectively. The cold plates 34 are shown with the tapered portion 96 having a brazed connection 84 into a cold plate manifold 94 for distributing the liquid. In the tapered portion 96, the narrower end 95 is positioned toward the front 80 and the wider end 97 is positioned toward the rear 82. FIG. 4A shows the fins 99, for rejecting heat into the liquid, internal to the tapered portion 96. Circuit assembly 36 is mounted between two cold plates 96, 100. The circuit assembly 36 is tapered with the narrow end 102 toward the rear 82 of the card cage 30 and the wider end 104 toward the front 80. Electrical connection 92 to the circuit assemblies 36 is at the rear 82 of the card cage 30 in this embodiment.

Figure 4B:
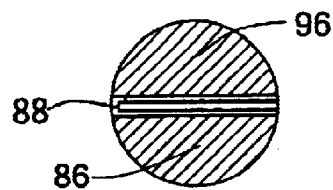
FIG. 4B is a detail view of an interface between a cold plate and a circuit board assembly according to the invention.

When the circuit assemblies 36 are inserted in the card cage 30, they are first inserted into the slots between the cold plates 34 by hand. The tapers of the tapered portion 96 and the personality plates 86 are such that the flat surfaces of the cold plates 34 and the circuit assemblies 36 are parallel during this insertion, but the clearance is sufficient that the placement of the circuit assemblies 36 is allowed. The ejection handles 90, incorporating a soft element such as a spring, provide sufficient force to seat the circuit assemblies 36 into position compressing the cold plates and circuit board assemblies together improving the thermal contact. Such ejection handles 90 provide a pressure that is distributed along the entire edge of the circuit board assembly and engages the thermal plates and any electrical connection in a backplane when the handles are closed. FIG. 4B illustrates the contact where the personality plate 86 is intimately contacting the tapered portion 96 through an interface material 88 between them.

Figure 5:
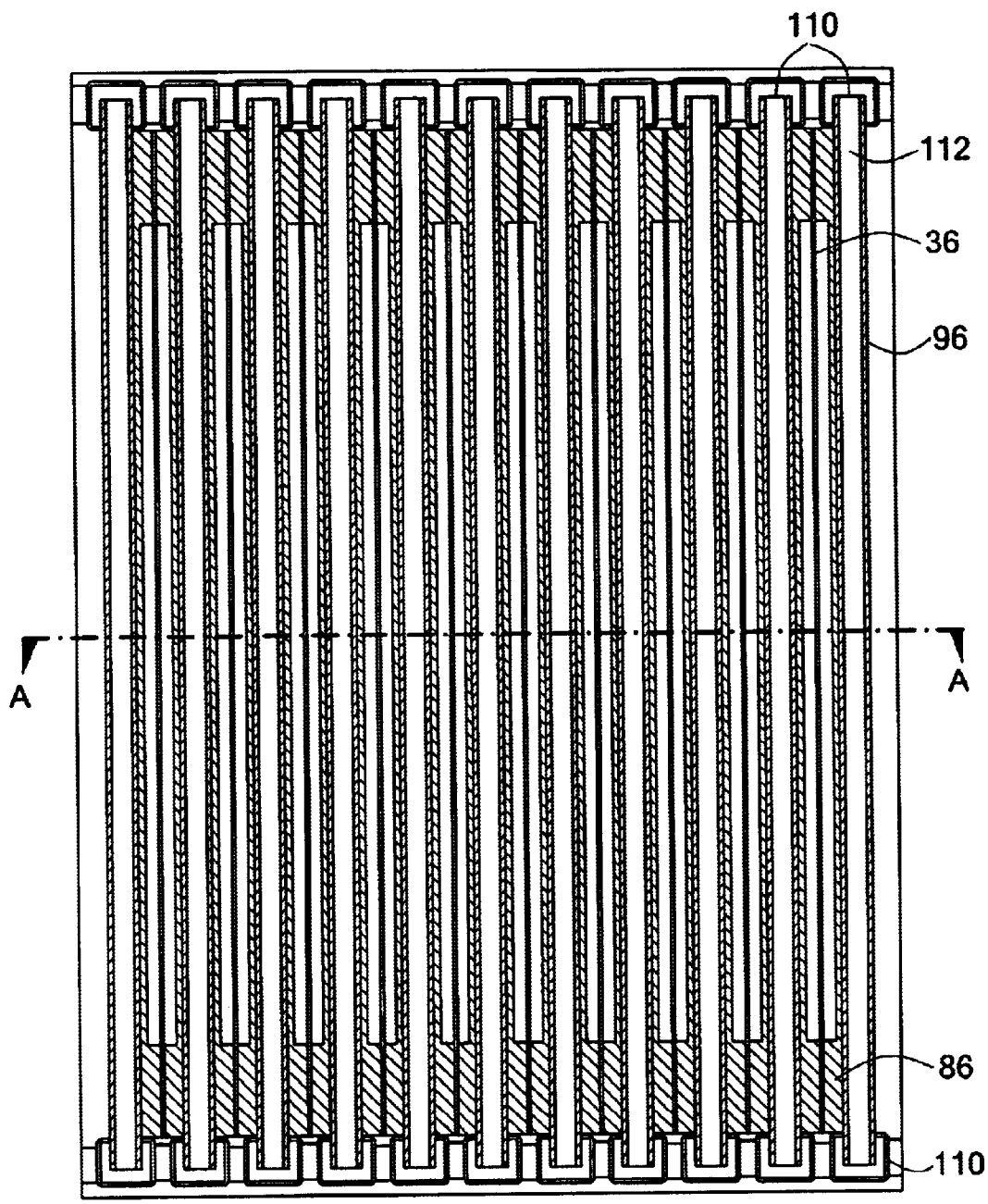
FIG. 5 is a second section view of the card cage of FIG. 2.

FIG. 5 is a view along section B—B of the card cage 30. The tapered portions 96 of the cold plates 10 are a uniform thickness in this direction. The area for a liquid, supplied through manifolds 110, is shown internal to the tapered portion 96. Circuit board assemblies 36 are interleaved between the taper portions 96 with personality plates 86 on each side of the printed circuit board.

The cold plate 34, through which liquid is circulating, then cools off the personality plate 86, which in turn, then cools off the components 52 of the electronic circuit board 51. Interface material improves the thermal connection between the cold plate and the personality plate but may be omitted. Because of the narrow angle of the taper, it is possible to achieve a relatively large clamping force between the personality plate and the cold plate. The large clamping force further improves the thermal connection between the circuit board and he personality plate.

The card cage 30 and circuit board assembly 36 embodiment above are illustrative of possible configurations. Alternate configuration could utilize printed circuit boards with components having a greater height necessitating a wider spacing between cold plates 8. For configurations utilizing single sided boards, only one personality plate would be needed, but the taper for that personality plate would have to equal the taper of the tapered portion of the cold plate contacting the board assembly. Interface material could be applied to the non-component side of the circuit assembly to improve heat transfer. Cold plates can be made having a flat area with an area of up to 24"×20" but there is significant challenge to producing sides with sufficient flatness. There are several methods to fabricate cold plates with each having different size and cost limitations. The more economical cold plates can be formed by an extrusion process.

FIG. 6A illustrates a configuration that might be created for a set of circuit boards that cluster high power/high heat components in one area of the board. Here, a card cage 120 that supports both liquid and air-cooling is created. Cold plates and liquid manifolds (not shown) are installed in rearward section 126 of the card cage 120. Provisions for air cooling, such as a fan 130 or other air cooling mechanism, and perforations in the top 127 of the card cage 120 are installed in the air-cooled portion 128 of the card cage 120. The complexity of this hybrid cooling is justified by the high cost of liquid cooling and the reduced cost when a smaller area must be cooled this way. A circuit board assembly 124 for this system is illustrated in FIG. 6B. The portion of the board 124 requiring liquid cooling is fit with personality plates 122 as described above while the portion to be air-cooled 123 is not.

When the flat portion is formed into a box shape, the insertion process for the card cage previously described is not operational. Instead, an embodiment like the one illustrated in FIG. 7 is used to compress the circuit board assemblies and cold plates together. Dual liquid manifolds 172 are illustrated. One cold plate 161 is held fixedly between the manifolds 172 and has a permanent plumbed connection 164 to the manifolds 172. The remaining cold plates 163 are spaced apart and held between the manifolds 172 by a flexible connection 166. Except for the plumbing connection, cold plates 161 and 163 are identical having dual headers 162 and flat portions 160 of the same size and thermal capacity. Circuit board assemblies 169, composed of a printed circuit board 168 clamped between box-like personality plates 170, 171, are inserted between the flat portions 160 of the cold plates. Once all the circuit board assemblies 169 are inserted, a compression mechanism, such as the illustrated press, exerts force on the stacked cold plates 161, 163 and circuit board assemblies 169 to bring them into tight thermal contact. As a result of the pressure, cold plates 163 will be displaced toward the fixed cold plate 161 and the flexible connections 166 to the manifolds 172 will flex.

The separation of the prior art's personalized cold plate into a standard cold plate and personality plates for each circuit board is useful because the standard cold plates can be continuously connected to a liquid source removing the prime potential for leaks. With the possibility of leaks reduced, water may be used as the cooling liquid replacing the much more expensive high dielectric liquids. Personality plates need to be thermally conductive but do not need to have passageways for liquid. It is much less expensive to create solid personality plates that to create a cold plate with a personality face.

In one embodiment, two phase flow of the liquid is used. In this case, a refrigerant is used as the liquid and evaporates in the cold plate as heat is absorbed. The resultant gas is reliquefied in an external system. This embodiment provides an even greater degree of cooling than can be effected with just circulation of a cooling liquid.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

What is claimed is:

1. A populated printed circuit board cooling system comprising:

a cold plate, formed of a heat transmissive material, with internal liquid circulating paths comprising:
at least one header portion for connection to a liquid circulating source and return; and
a heat absorbing portion for enclosing the internal liquid circulating paths, having at least one flat planar surface, the at least one header portion connected to a top or bottom of the heat absorbing portion, a top or bottom not connected to the at least one header portion being closed; and at least one personality plate, formed of a heat transmissive material, each having a flat side and a contoured side, wherein each contoured side conforms to a corresponding profile of a populated printed circuit board, and wherein, when the flat planar surface of the cold plate and the flat surface of the at least one personality plate are placed in contact and the side of the printed circuit board is in contact with the contoured side of the at least one personality plate, heat is transferred from components on the printed circuit board through the personality plate to the cold plate to be removed by a circulating liquid, and wherein each flat surface of the at least one personality plate and the flat planar surface of the cold plate are angled with respect to the printed circuit board.

2. The system of claim 1 wherein the beat transmissive material of the cold plate is selected from the group of copper, aluminum, copper alloy and aluminum alloy.

3. The system of claim 2 wherein the heat transmissive material is copper.

4. The system of claim 1 wherein the heat transmissive material of the at least one personality plate is selected from the group of copper, aluminum, copper alloy, aluminum alloy, metal filled composite and moldable material with high thermal transmissivity.

5. The system of claim 4 wherein the heat transmissive material is copper.

6. The system of claim 1 wherein the heat transmissive material of the cold plate and the at least one personality plate are the same material.

7. The system of claim 1 wherein the cold plate has two header portions, one attached across the top edge of the heat absorbing portion and the second attached across the bottom edge of the heat absorbing portion.

8. The system of claim 1 wherein the cold plate has one header portion attached across the top edge of the heat absorbing portion.

9. The system of claim 1 further comprising:
thermal interface material interposed between the flat surfaces of the cold plate and the flat side of the at least one personality plate.

10. The system of claim 1 further comprising:
thermal interface material interposed between the components on the printed circuit board and the contoured side of the corresponding personality plate.

11. A populated printed circuit board cooling system comprising:
a cold plate, formed of a heat transmissive material, with internal liquid circulating paths comprising:
at least one header portion for connection to a liquid circulating source and return; and
a heat absorbing portion for enclosing the internal liquid circulating paths, having at least one flat planar surface, the at least one header portion connected to a top or bottom of the heat absorbing portion, a top or bottom not connected to the at least one header portion being closed; and
at least one personality plate, formed of a heat transmissive material, each having a flat side and a contoured side, wherein each contoured side conforms to a corresponding profile of a populated printed circuit board, and
wherein, when the flat planar surface of the cold plate and the flat surface of the at least one personality plate are placed in contact and the side of the printed circuit board is in contact with the contoured side of the at least one personality plate, heat is transferred from components on the printed circuit board through the personality plate to the cold plate to be removed by a circulating liquid, and wherein the heat absorbing portion is formed of two flat planar surfaces joined forming a wedge having a narrow end and a wider end.

12. The system of claim 1 wherein the heat absorbing portion is formed of two flat planar surfaces joined forming a box.

13. A method of cooling populated printed circuit boards comprising:
fabricating a card cage incorporating a plurality of wedge-shaped cold plates with flat sides, permanently connected to a liquid circulating mechanism, arranged to allow board mounting between the cold plates;
forming printed circuit board assemblies by sandwiching each populated printed circuit board between personality plates, each personality plate having a flat surface on one side and conforming to the contour of a side of the populated printed circuit board on the other side, the personality plates made of a heat transmissive material;
inserting the printed circuit board assemblies into the card cage with the flat sides of the personality plates parallel to flat sides of the cold plates;
applying force to press the printed circuit board assemblies and cold plates together; and
circulating liquid through the cold plates.

14. An apparatus for cooling components on printed circuit boards comprising:
a card cage;
a plurality of cold plates each permanently connected to a mechanism circulating cooling liquid through a plurality of headers mounted to a top and bottom of each cold plate, each cold plate formed as a wedge shape with flat sides oriented toward a side of the card cage, a narrow end toward a front of the card cage and a wider end toward a rear of the card cage, the plurality of cold plates made of a heat transmissive material;
a plurality of circuit board assemblies each formed based on a printed circuit board, each circuit board assembly comprising:
a first personality plate having a plate contoured surface complementary to a first side contoured surface of the printed circuit board, the first plate contoured surface pressed to the first side contoured surface;
a second personality plate having a plate contoured surface complementary to a second side contoured surface of the printed circuit board, the second plate contoured surface pressed to the second side contoured surface; wherein the first and second personality plates are formed of a heat transmissive material and have plate flat surfaces opposed to the plate contoured surfaces, the plate flat surfaces angled such that each circuit board assembly is wedge shaped with the same wedge angle as the cold plates, but with the narrow end facing the rear of the card cage when the circuit board assembly in installed in the card cage;
a recessed fastening mechanism holding the personality plates and printed circuit board tightly pressed together forming the circuit board assembly; and
a plurality of clamping mechanisms, each structured to fully seat a circuit board assembly between a pair of cold plates, pressing the flat surfaces of the cold plates and the personality plates together forming a thermal path from the components, through the personality plates to the cold plates.

15. The apparatus of claim 14 further comprising an interface material covering the cold plate flat surfaces.

16. The apparatus of claim 14 further comprising an interface material disposed between the components and the personality plates.

17. A heat extraction device for a component populated printed circuit board having one or more components thereon comprising:
a personality plate having a first side contoured to match a contour of a side of the printed circuit board to provide thermal conductivity between the one or more components and the personality plate when associated with the printed circuit board with contoured sides thereof in thermal contact with the one or more components;
the personality plate having a second side adapted for engaging a heat sink in thermal conducting contact upon activation of a contacting means, and wherein the second side of the personality plate and a contact surface of the heat sink are angled with respect to the printed circuit board.

18. The heat extraction device of claim 17, further comprising:
a printed circuit board receiving assembly;
a heat sink associated with the receiving assembly and having a surface mating with the second side of the personality plate;
locking means for removably securing the printed circuit board with the personality plate associated therewith with the second side thereof in thermal contact with the heat sink mating surface for thermal transfer.

* * * * *